US006284006B1

(12) United States Patent
Siefering et al.

(10) Patent No.: US 6,284,006 B1
(45) Date of Patent: Sep. 4, 2001

(54) PROCESSING APPARATUS FOR MICROELECTRONIC DEVICES IN WHICH POLYMERIC BELLOWS ARE USED TO HELP ACCOMPLISH SUBSTRATE TRANSPORT INSIDE OF THE APPARATUS

(75) Inventors: Kevin L. Siefering, Excelsior; Timothy V. Seppanen, Waconia, both of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/440,388

(22) Filed: Nov. 15, 1999

(51) Int. Cl.$^7$ .............................. H01L 21/44; H01L 21/66
(52) U.S. Cl. .............................................. 29/25.01
(58) Field of Search ............................................. 29/25.01

(56) References Cited

U.S. PATENT DOCUMENTS

| | | | |
|---|---|---|---|
| 5,135,608 | * | 8/1992 | Okutani . |
| 5,534,107 | * | 7/1996 | Gray et al. . |
| 5,580,421 | * | 12/1996 | Hiatt et al. . |
| 5,716,495 | * | 2/1998 | Butterbaugh et al. . |
| 5,782,986 | * | 7/1998 | Butterbaugh et al. . |
| 5,922,219 | * | 7/1999 | Fayfield et al. . |
| 5,954,884 | * | 9/1999 | Lawing et al. . |
| 6,015,503 | * | 1/2000 | Butterbaugh et al. . |
| 6,065,481 | * | 5/2000 | Fayfield et al. . |
| 6,083,413 | * | 7/2000 | Sawin et al. . |
| 6,107,166 | * | 7/2000 | Butterbaugh et al. . |
| 6,124,211 | * | 9/2000 | Butterbaugh et al. . |
| 6,165,273 | * | 12/2000 | Fayfield et al. . |
| 6,183,566 | * | 2/2001 | Lawing et al. . |

FOREIGN PATENT DOCUMENTS 61-224327 * 10/1986 (JP) .

* cited by examiner

Primary Examiner—David E. Graybill
(74) Attorney, Agent, or Firm—Kagan Binder, PLLC (57) ABSTRACT

Transport system that allows in-process microelectronic devices inside a chamber to be easily moved, regardless of whether the chamber is open or sealed. Advantageously, the source of in-process device motion is located outside of the chamber, while the motion is transferred to the wafer via a polymeric bellows. Inside the chamber, there are no parts of the system that rub against other componentry. Consequently, the system generates little, if any, contaminants.

22 Claims, 9 Drawing Sheets

PROCESSING APPARATUS FOR MICROELECTRONIC DEVICES IN WHICH POLYMERIC BELLOWS ARE USED TO HELP ACCOMPLISH SUBSTRATE TRANSPORT INSIDE OF THE APPARATUS

FIELD OF THE INVENTION

The present invention is in the field of equipment that is used to fabricate microelectronic devices. More specifically, the present invention relates to an apparatus for processing microelectronic devices in which the apparatus incorporates a transport mechanism allowing a device to be moved through a range of motion inside the chamber.

BACKGROUND OF THE INVENTION

Microelectronic devices include integrated circuits, flat panel displays, thin film heads, transistors, diodes, and the like. During manufacture, it is common for a plurality of microelectronic devices to be formed upon a thin slice of semiconductor material. This thin slice of semiconductor material is referred to as a semiconductor wafer. After the devices are formed on the wafer, the finished structure may be sliced into individual devices or clusters of such devices, as desired. Microelectronic devices, in-process microelectronic devices, and the wafers themselves tend to be brittle and extremely sensitive to contamination. Even minute traces of microscopic contaminants can significantly impair the performance of one or more of the devices being formed on a wafer. Thus, exceptional care is taken to clean, avoid damaging, and/or avoid contaminating in-process microelectronic devices.

To make microelectronic devices, in-process microelectronic devices generally are transferred to and from a succession of processing units. These units may be stand-alone stations all couple together in a tool cluster. At each unit, one or more specific process operations may be carried out. Many different processing units are involved in the fabrication process. Typical units involve cleaning, etching, drying, photolithography, deposition of materials, polishing, planarization, and the like.

Wafer handling (also referred to as wafer transport) refers to techniques by which one or more in-process microelectronic devices are transferred from processing unit to unit (i.e., interstation transfer), or from position to position at a particular unit (intrastation transfer). Wafer handling must be accomplished without damaging or contaminating the in-process microelectronic devices. Wafer handling can be especially challenging when an in-process microelectronic device must be moved after the in-process microelectronic device has been inserted into a chamber that is small or that has been environmentally sealed. For example, consider a representative processing unit at which an in-process microelectronic device is to be treated with one or more treatment gases that are used to dry, clean and/or etch, one or both surfaces of the wafer. Because such treatment gases can be highly corrosive and/or because the treatments must occur under carefully controlled conditions (e.g., controlled temperature, humidity, vacuum, and the like) in which exposure of the wafer to contaminants is to be avoided, the processing chamber of such a unit is desirably environmentally sealed from the ambient.

In many applications, it is desirable to move an in-process microelectronic device upon demand from one position within such a chamber to one or more other positions in the chamber, either before or after the chamber is environmentally sealed. For example, an in-process microelectronic device initially might be loaded by a robot handler or other suitable wafer transport mechanism into the chamber in a loading position, after which the an in-process microelectronic device is then moved by some kind of transport mechanism through a range of motion (perhaps comprising movement along the z-axis, i.e., moved vertically up or down) from the loading position to a processing position in order to more effectively carry out one or more desired treatments. After such treatments are completed, the in-process microelectronic device can be moved to a suitable position (which may be the same as the loading position) from which the in-process microelectronic device may be withdrawn by the robot from the chamber.

If the robot being used to load and withdraw the in-process microelectronic device to and from the chamber is not able to cause the desired movement of the wafer within the chamber for one reason or another, some other type of transport mechanism must be used to accomplish the desired wafer movement. Such a transport mechanism generally may be located inside the chamber, outside the chamber, or it could be positioned at least partially in both locations. It is generally undesirable, however, to incorporate a transport mechanism or a portion thereof into the interior of the chamber itself for a variety of reasons. In particular, the movement and operation of the mechanism can generate contaminating debris as different parts of the mechanism move against each other. This, of course, is to be avoided. Additionally, the corrosive treatment gases used in many treatments can also unduly compromise the useful life of such mechanisms.

Accordingly, it would be much more desirable to position any such transport mechanism outside of the chamber. Yet, exterior placement of the transport mechanism poses significant challenges. Specifically, the mechanical movement created by the actuation mechanism located outside of the chamber must somehow be imparted to the in-process microelectronic device located inside of the chamber without compromising the integrity of the carefully controlled environmental conditions of the chamber. It would be desirable to provide an approach that would allow a wafer to be transported inside of a processing chamber in a manner that avoids generating contaminating debris inside the chamber and that can be used whether the chamber is opened or sealed.

SUMMARY OF THE INVENTION

The present invention provides a transport system that allows in-process microelectronic devices inside a chamber to be easily moved, regardless of whether the chamber is open or sealed. Advantageously, the source of in-process device motion is located outside of the chamber, while the motion is transferred to the wafer via a polymeric bellows. Inside the chamber, there are no parts of the system that rub against other componentry. Consequently, the system generates little, if any, contaminants.

In one aspect, the present invention relates to an apparatus used to process an in-process microelectronic device. The apparatus includes a chamber in which the in-process microelectronic device is positioned during a treatment. The chamber includes at least one bellows portal. The in-process microelectronic device is supported upon a moveable support that can be moved through a range of motion comprising a loading position and a processing position. A polymeric bellows seals the bellows portal. The bellows has a fixed end and a moveable end. The moveable end is operationally coupled to the moveable support such that actuation of the moveable end causes a corresponding movement of the moveable support.

In another aspect, the present invention relates to an apparatus that is used to process an in-process microelectronic device with one or more process gases. The apparatus includes an enclosure defining a chamber in which the in-process microelectronic device is positioned during processing. The chamber includes a wall having a pocket. The apparatus also includes a moveable support that can be moved through a range of motion comprising a loading position and a processing position. The moveable support is at least partially positioned in the pocket of the wall when the member is in the processing position.

BRIEF SUMMARY OF THE DRAWINGS

FIG. 4 is a close up view of a portion of the cross-section of FIG. 3a.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather, the illustrative embodiments are described so that others skilled in the art may appreciate and understand the principles and practices of the present invention.

For purposes of illustration, the principles of the present invention will now be described in connection with apparatus 10 shown in FIGS. 1–6. Apparatus 10 is a representative type of apparatus in which a microelectronic device, such as in-process semiconductor device 12 (hereinafter referred to more simply as device 12), is to be treated with one or more treatment gases that are used to process, e.g., to clean and/or etch, one or both surfaces 14 and 16. Advantageously, as illustrated in connection with representative apparatus 10, the principles of the present invention allow an in-process microelectronic device 12 to moved about inside chamber 18 in a controlled, reliable, repeated fashion, even after chamber 18 is environmentally sealed for processing and without compromising the environmental integrity of chamber 18.

Figure 1:
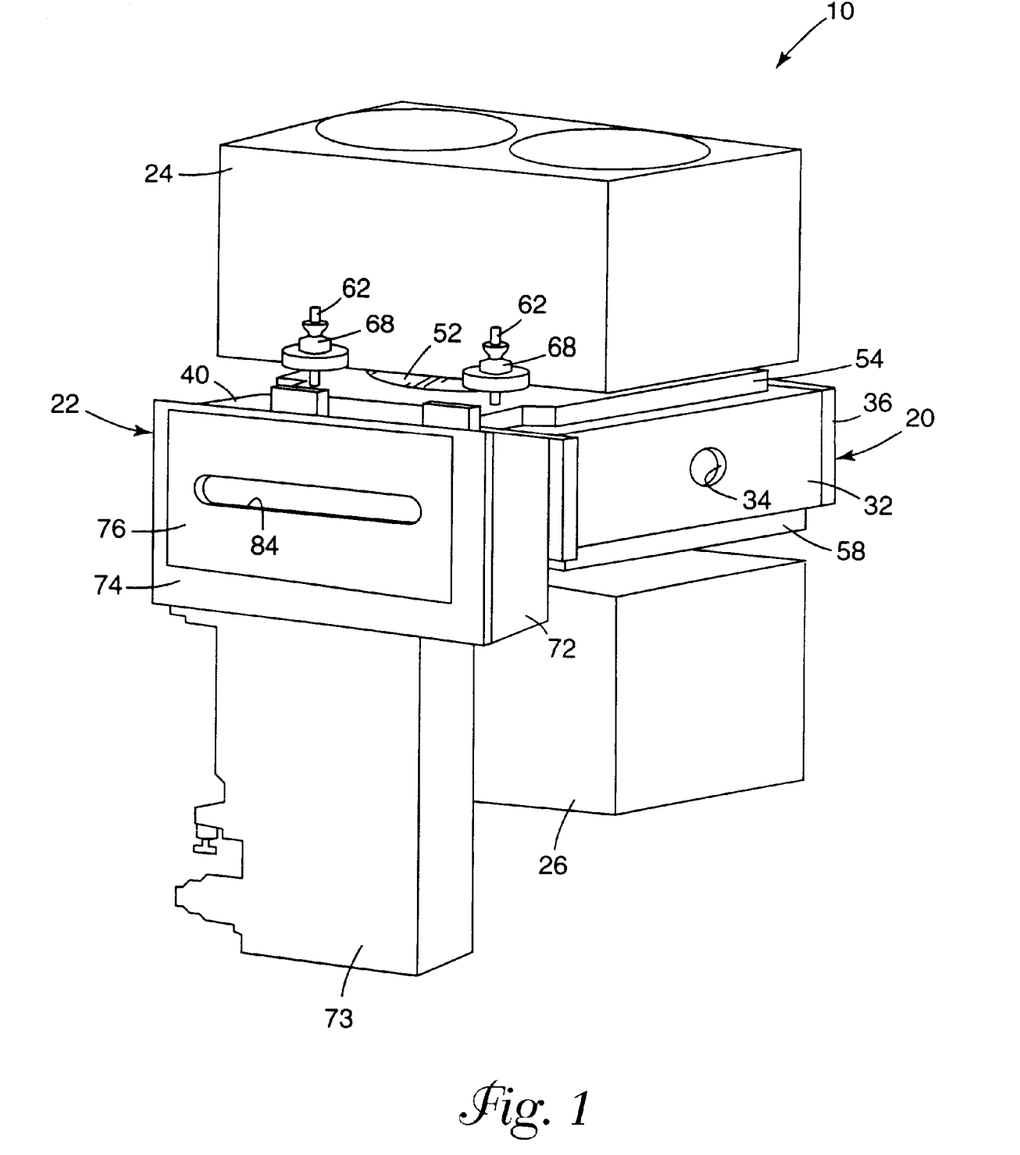
FIG. 1 is a perspective view of one embodiment of an apparatus incorporating principles of the present invention.
Figure 2:
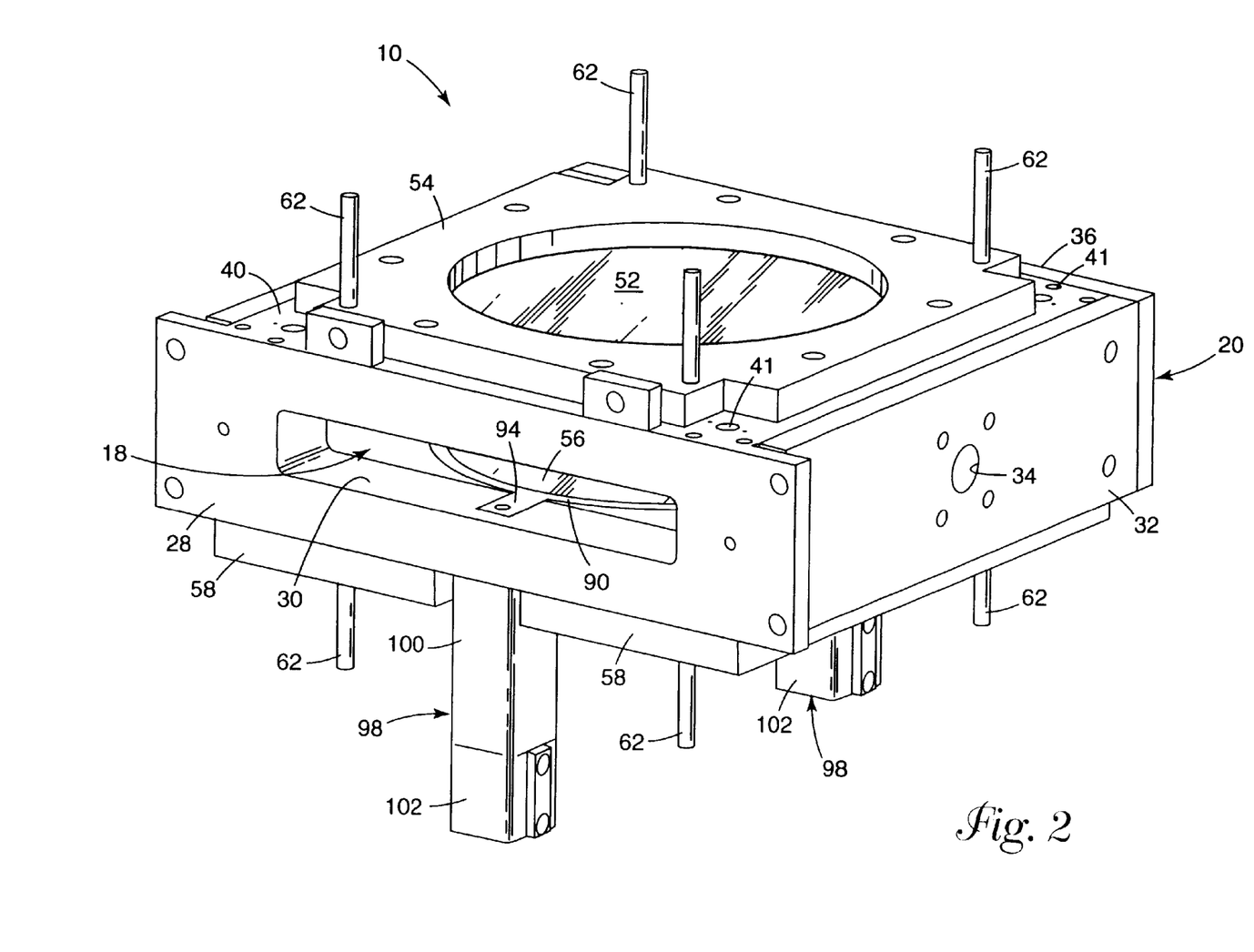
FIG. 2 is a perspective view of the apparatus of FIG. 1 with the gate valve componentry and the ultraviolet lamps removed.

In more detail, apparatus 10 includes housing 20 enclosing process chamber 18, gate valve assembly 22, and a pair of energy sources 24 and 26 mounted onto housing 20. Apparatus 10 may be used as a stand-alone unit that is not directly clustered or otherwise coupled to other processing units. Alternatively, as shown, apparatus 10 may be directly coupled to other process tooling, such as cluster tooling 78. A specific example of one kind of cluster tooling 72 that is particularly suitable for use with apparatus 10 is a system commercially available from Applied Materials, Inc. under the trade designation CENTURA.

Housing 20 includes front wall 28 having wafer portal 30 through which device 12 can be inserted into and withdrawn from chamber 18. Each of side walls 32 includes a respective port 34 through which process gases can be fed or withdrawn from chamber 18 during processing. Rear wall 36 includes portal 38 through which process gases can be fed or withdrawn. Portal 38 may also be used to attach a relatively powerful vacuum pump (not shown) to chamber 18 for rapid pumping. The vacuum pump may be any conventional vacuum pump such as a rough pump or a turbo pump. Gas flow through chamber 18 is preferably from side-to-side from one gas port 34 to the other gas port 34, thus being parallel to front wall 28 wafer portal 30.

Figure 3A:
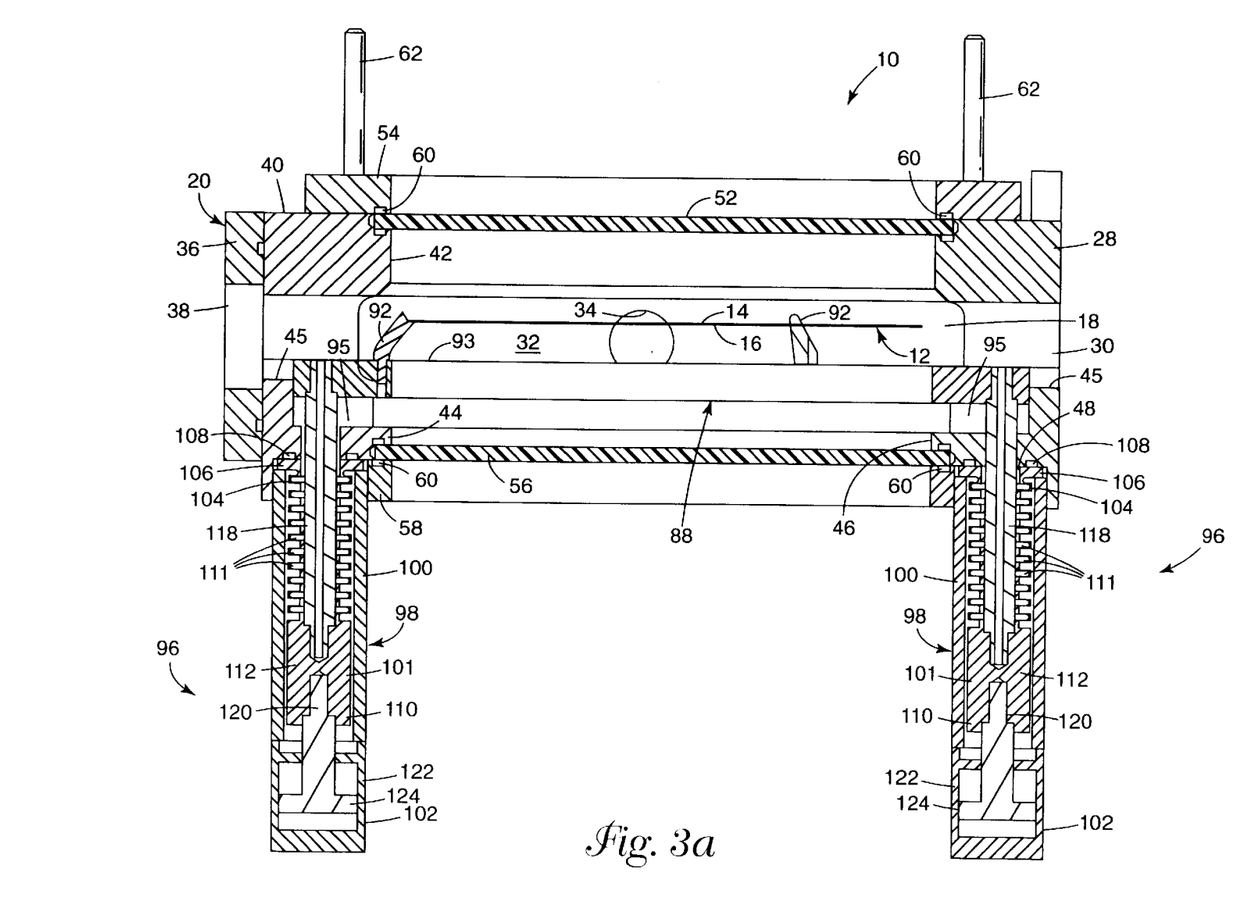
FIG. 3a is a side cross-section of the processing chamber enclosure incorporated into the apparatus of FIG. 1, wherein the ring-shaped frame is in a raised, loading position.
Figure 3B:
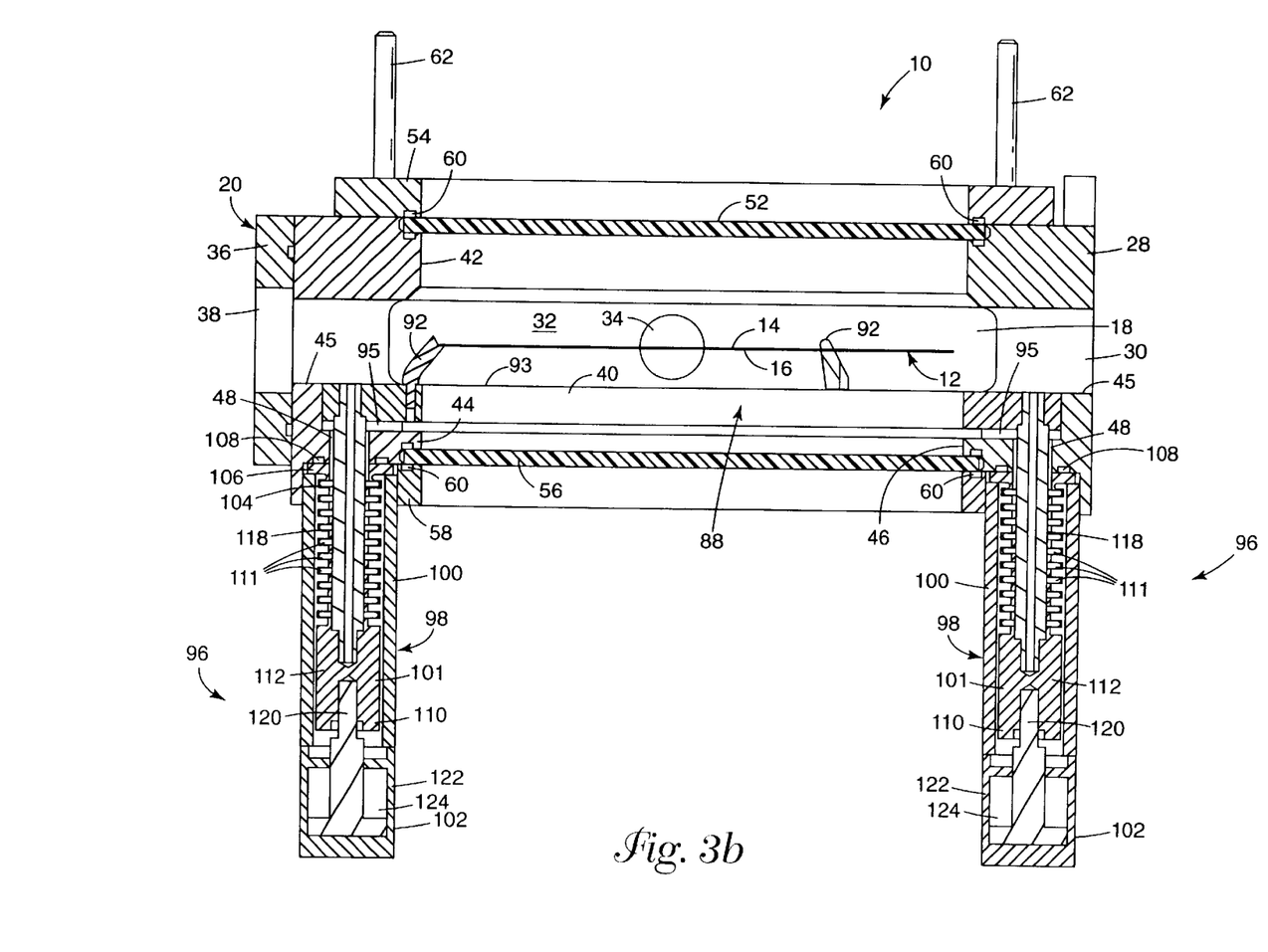
FIG. 3b is a side cross-section of the processing chamber enclosure incorporated into the apparatus of FIG. 1, wherein the ring-shaped frame is in a lowered, processing position.

Top wall 40 includes circular aperture 42 that is covered by window 52. Top cover 54 is used to hold window 52 in position. In a similar fashion, bottom wall 44 includes circular aperture 46 which is covered by window 56. Bottom cover 58 is used to hold window 56 in position. Annular seals 60 are used to help seal the juncture between top cover 54 and top wall 40 and between bottom cover 58 and bottom wall 44, respectively. Top wall 40 also includes apertures 41 to allow cartridge heaters (not shown) and temperature sensors (not shown), other processing aids, or the like, to be fitted into chamber 18, as desired.

Housing 20 and chamber 18 preferably are substantially square in shape as viewed from above. One embodiment of such a substantially square housing 20 suitable for processing a 200 mm in-process wafer being about 13 inches (33 cm) by 13 inches (33 cm), when viewed from the top. A housing 20 of this size preferably has a depth of about 4 inches (10 cm).

The components used to form housing 20 can be formed from a wide variety of materials, but should be substantially inert to the treatment gases used during processing. The materials should also be resistant to the temperatures and pressures likely to be encountered during processing. For example, when the intended process gases include corrosive gases such as HF, chlorine, ozone, and/or the like, each of walls 25 28, 32, 36, 40, and 44, as well as ring clamps 54 and 58, may be fabricated from an inert material such as 316 stainless steel, polytetrafluoroethylene (PTFE), perfluoroalkoxy (PFA), polyvinylidene fluoride (PVDF), fluoroethylene polymer (FEP), ethylene tetra fluoroethylene (ETFE), polyvinyl fluoride (PUF), other rigid fluoropolymers, combinations of these, and the like. Alternatively, metal, wood, or polymeric components that are encapsulated with inert materials, such as those listed above, may also be used to form the parts of housing 20. For instance, preferred housing components are fabricated from aluminum that is coated with a General Magnaplate Nedox 615 coating.

Windows 52 and 56 allow respective fluences of energy from energy sources 24 and 26 to be independently irradiated onto surfaces 14 and 16, respectively, of device 12. Accordingly, windows 52 and 56 must not only be inert to the treatment gases and resistant to the process temperatures and pressures, but also must be sufficiently transmissive to the type of energy emitted from energy sources 24 and 26. In preferred embodiments in which energy sources 24 and 26 are in the form of ultraviolet lamps, each of windows 52 and 56 may be made from a UV transparent material such as sapphire or quartz, preferably sapphire. Preferred UV lamps are commercially available from Xenon Corp. and house two UV flash lamp bulbs, a parabolic reflector for each bulb, electronics, and a pair of cooling fans.

Energy sources 24 and 26 are each mounted onto pins 62 projecting outward from housing 20. Suitable fasteners 68 are used to hold energy sources 24 and 26 onto pins 62. A preferred fastener is a quick release fastener that slide down over pins 62 and automatically lock in place. Each such fastener includes a quick-release collar allowing the fastener to be removed simply by pulling on the collar. This makes it easy to remove the sources 24 and 26 for service or replacement. Of course, instead of pins 62 and fasteners 68, other securing approaches such as nuts and bolts, screws, clips, welds, or the like may be used.

Figure 6:
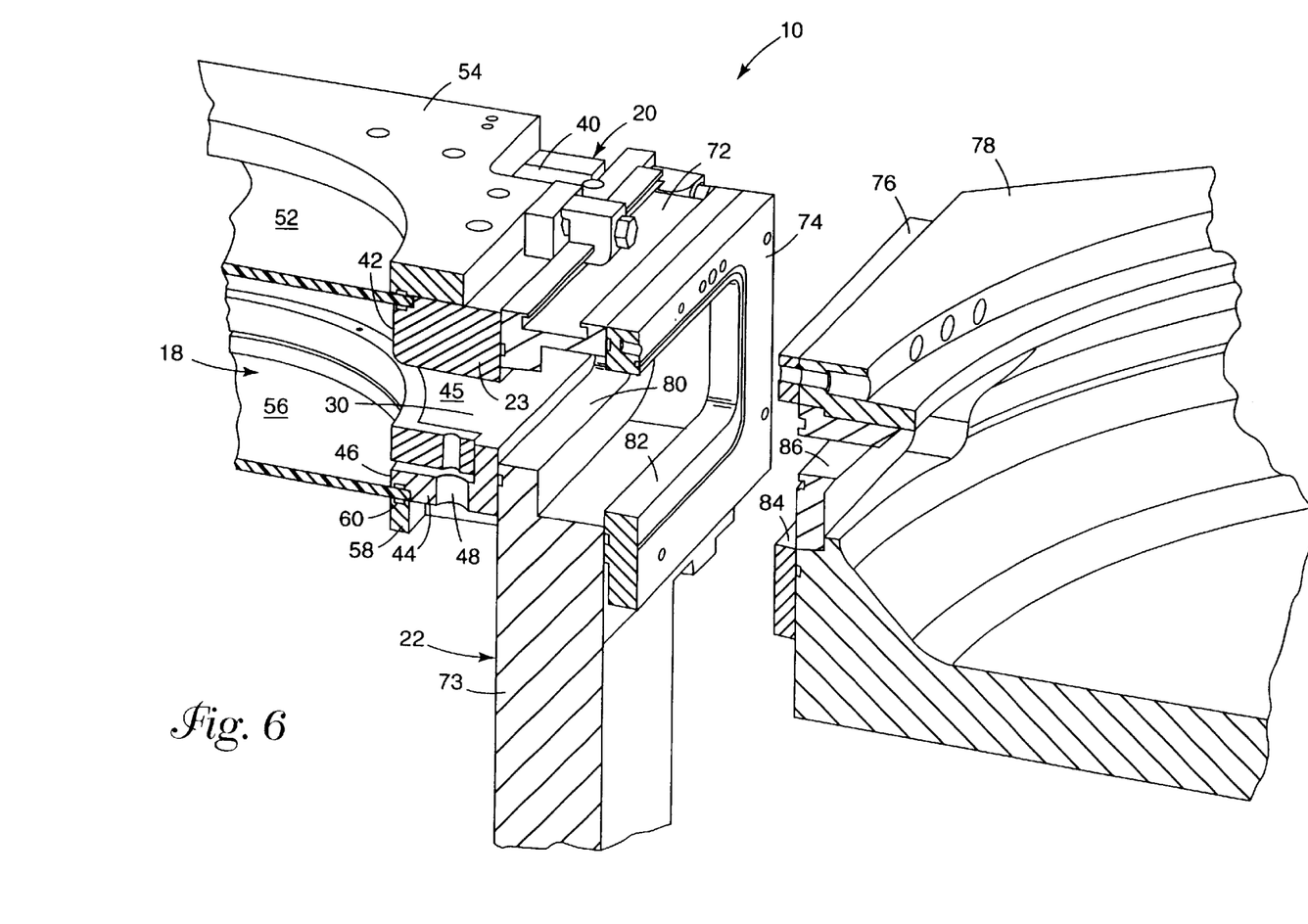
FIG. 6 is a perspective view of a portion of the apparatus of FIG. 1 shown in partial cross-section.

Gate valve assembly 22 is shown best in FIGS. 1 and 6. Gate valve assembly 22 includes gate valve 72 having a gate door (not shown) that can be actuated by gate actuator mechanism 73 to open and close wafer portal 30. Gate valve 72 preferably is in the form of an industry standard, double acting MESC slot valve opening. Such a slot valve may be pneumatically driven in both directions to open and close. Adapter plate 74 including wafer portal 82 provides an adaptive fitting to help couple gate valve 72 to portal 86 of cluster tool 78. Insulator plate 76 having wafer portal 84 provides thermal insulation between cluster tool 78 and adapter plate 74. Insulator plate 76 preferably is formed from an inert polymeric material such as PVDF, PFA, polytetrafluoroethylene, combinations of these, or the like. Adapter plate 74 is desirably fabricated from a metal, of which 316 stainless steel is preferred. Gate valve 72 also is desirably fabricated from a metal, of which 316 stainless steel is preferred.

During processing, especially during etching processes, it is desirable to maintain the gate valve temperature at the same temperature as chamber 18 in order to obtain optimal etch uniformity. To heat gate valve 72, it is preferred to mount a flexible, 24 VAC (250 Watt) heater to gate valve 72 using a pressure sensitive adhesive, thus eliminating the need for a ground plane, ground wiring, and armor sheathing which are typically required when using high voltage heaters.

For some treatments, it is important to carefully manage the pressure inside chamber 18 during wafer transfer to and from chamber 18. Chamber 18 may be rough pumped using a dry pump/blower combination to a typical transfer pressure of about 10 torr (nitrogen). However, in order to minimize contamination of chamber 18 during wafer transfer, it is preferred to pump chamber 18 to 0.1 millitorr and then back fill chamber 18 to 10 torr with nitrogen prior to wafer transfer. This helps to ensure that contamination levels are no more than 10 ppm at 10 torr. As another option, chamber 18 may be turbo pumped to a base pressure as low as $10^{-6}$ torr to accomplish wafer transfer under high vacuum if desired.

Figure 5:
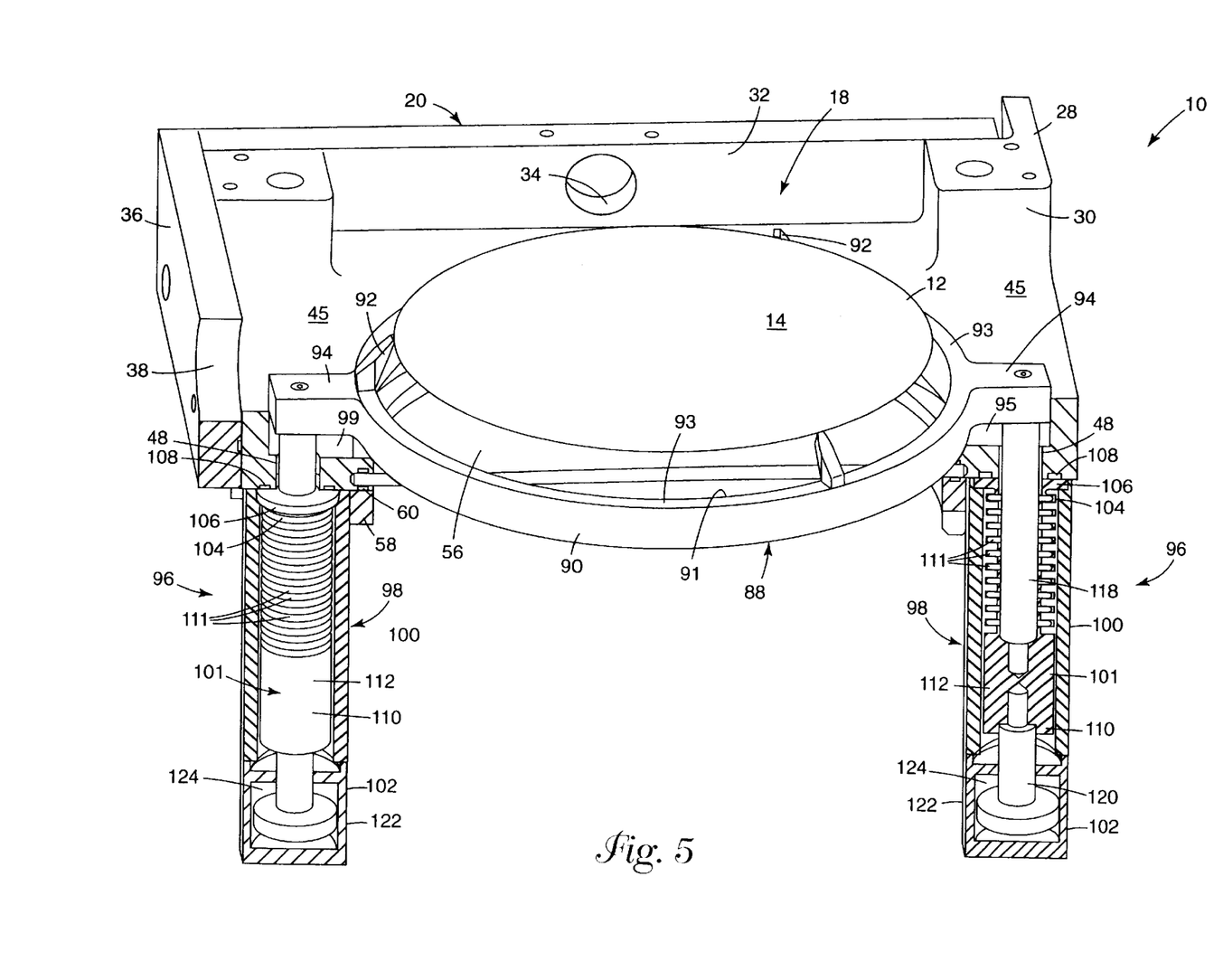
FIG. 5 is a perspective view of the apparatus of FIG. 1 in partial cross-section and with some parts removed in order to show the ring-shaped frame of the transport mechanism in more detail.

Moveable support 88 includes ring shaped frame 90 having a large, central aperture 91 through which a fluence of energy from energy source 26 can pass without being blocked to irradiate bottom surface 16 of device 12. Device 12 may be supported directly upon frame 90. Alternatively, device 12 may be supported on a plurality of protuberances extending from frame 90. For example, plurality of lift pins 92, preferably three in number, extend upward from ring shaped frame 90. Device 12 is supported upon these lift pins 92. At opposite ends of ring-shaped frame, ears 94 project outward and provide a convenient location to couple moveable support 88 to actuation source 96. Moveable support 88 can be raised and lowered through a range of motion to allow device 12 to be supported in a loading position at which device 12 can be inserted into and withdrawn from chamber 18.

Figure 4:
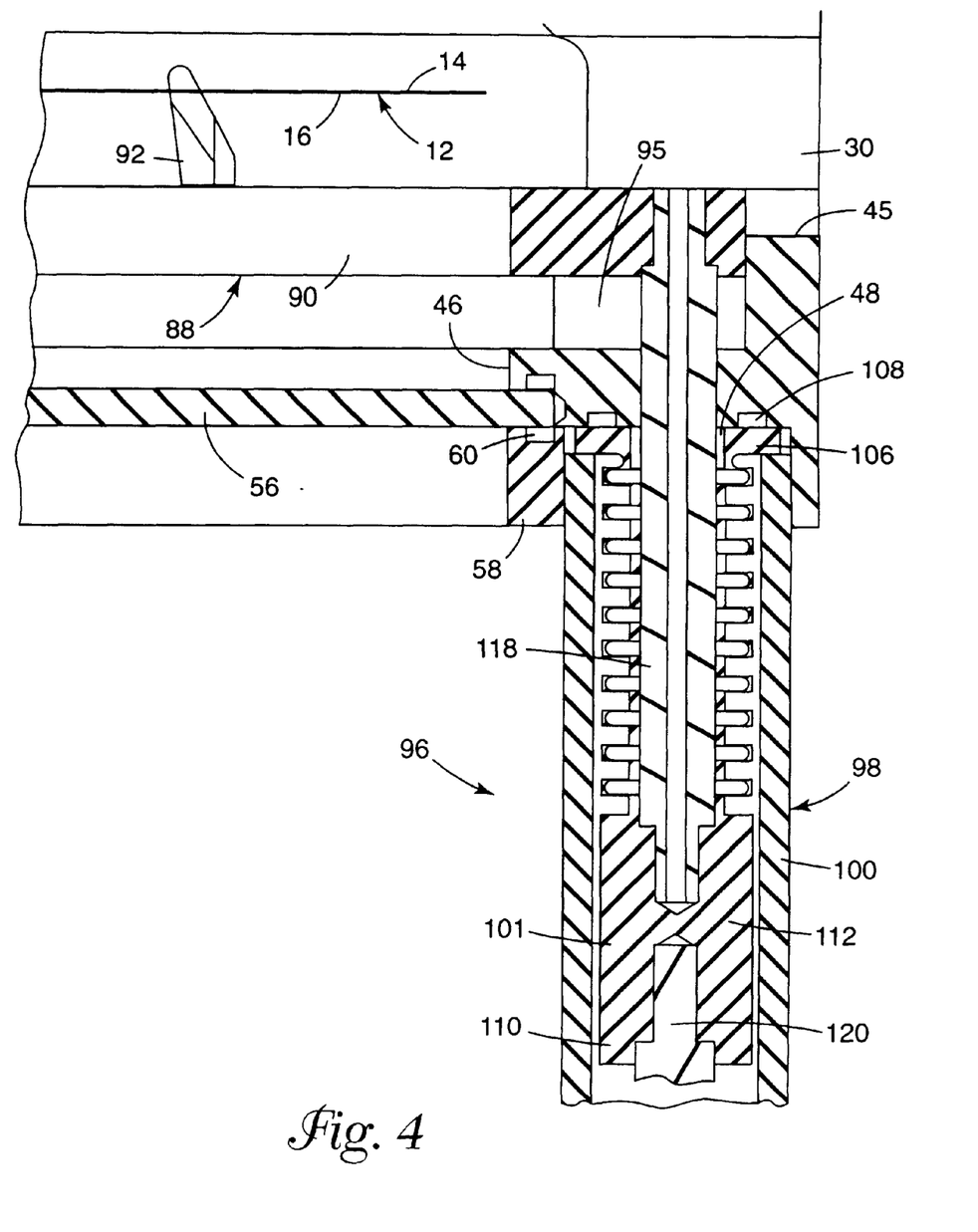

FIG. 5 shows moveable support 88 in a raised, loading position. After device 12 is loaded onto lift pins 92 when moveable support 88 is in such a loading position, moveable support 88 can be lowered to position device 12 in a processing position at which device 12 is suitably treated with one or more process gases. FIG. 4 shows moveable support 88 in a lowered, processing position. In the preferred embodiment as shown in FIG. 4, moveable support 88 is lowered sufficiently such that at least a portion, preferably all, of ring shaped frame 90 retracts into pocket 95 in housing bottom wall 44. More preferably, ring-shaped frame 90 is retracted sufficiently such that top surface 93 of ring shaped from 90 is flush with floor 45.

The retracted position of ring shaped frame 90 provides substantial benefit during processing. As process gases are conveyed through chamber 18, it is often critical to the resultant device performance for the flow of gases to be as uniform and as nonturbulent as practically possible in order to avoid nonuniform processing, e.g., nonuniform etching, of device 12. When frame 90 is retracted into pocket 95 and flush with floor 45, a smooth surface is provided for process gases to flow past. In contrast, if ring-shaped frame 90 were to remain above floor 45 during processing, frame 90 would obstruct gas flow, thus contributing to undesirable turbulence. Additionally, lift pins 92 optionally may be streamlined in the direction of gas flow to further minimize turbulence.

Actuation source 96 provides a simple, effective way to transfer mechanical motion into chamber 18. Actuation source 96 includes one or more, preferably two, housings 98, each of which includes upper bellows housing portion 100 and lower piston housing portion 102. Inside each bellows housing portion 100, polymeric bellows 101 performs at least two key functions. First, bellows 101 environmentally seals corresponding bellows portal 48. Each bellows 101 includes a fixed end 104 that is held in position by a clamping action over bellows flange 106. An o-ring made of a suitable inert, elastomeric polymer (such as Chemraz S13 polymer available from Greene, Tweed of Delaware, Inc. or the Kalrez polymers available from E. I. DuPont de Nemours and Co.) is positioned in a dove tail groove of bottom wall 44 to help provide a good seal around bellows portal 48. Bellows 101 also includes moveable end 110, which includes plug section 112. Accordingly, the interior of bellows 101 is environmentally isolated from the exterior of bellows 101.

In addition to sealing bellows portals 48, bellows 101 also help to transfer mechanical motion into chamber 18. In this regard, bellows convolutions 111 act in a manner similar to a spring so that moveable bellows end 110 can be moved up and down through a desired range of motion. The range of motion will depend upon a number of factors including the number of convolutions, the contour of the convolutions, the material used to form bellows 101, the characteristics of chamber 18, and the like. In a typical operation, a range of motion from 0.25 inches (6.35 mm) to 0.5 inches (12.7 mm) has been found to be suitable. For such a range of motion, a polymeric bellows formed from an inert polymer material, such as PTFE, PFA, FEP, ETFE, PVDF, and/or PVF (A preferred polymer material is commercially available under the trade designation HyQ PTFE from Entegris Upland Inc.), and having 3 to 15, preferably 4 to 10 convolutions would be suitable. For purposes of illustration, bellows 101 is shown with ten convolutions 111. Of course, the optimum number of convolutions depends upon factors such as the bellows material, desired service life, range of motion, convolution design, and the like. Convolutions 111 are shown as having a rectilinear outer contour and curvilinear inner contour, but may have other contours as desired, e.g., semi-circle-to-semicircle, zig-zag, or the like.

Advantageously, bellows 101 preferably is double-shafted, allowing mechanical motion to be transferred to the exterior of bellows 101, and then from the interior of bellows 101 to ears 94 on ring shaped frame 90. In this preferred approach no single shaft passes all the way through bellows 101, so that the sealing of portals 48 by each bellows 101 is not comprised. A first shaft 118 operationally couples the interior of moveable end 110 to a respective ear 92 via a pathway extending through bellows portal 48. A second shaft 120 operationally couples the exterior of moveable end 110 to actuation device 122. While any conventional actuation device capable of transferring a range of z-axis motion to shaft 120 may be used, a preferred actuation device 122 is a single acting, pneumatic cylinder such as the LPC low profile cylinder, Model No. 1062LPR-0.50-4-MT, commercially available from American Cylinder Co. This particular device is equipped with Hall effect sensors to provide monitoring signals indicative of when moveable support 88 is raised or lowered.

A single acting, pneumatic cylinder offers many performance benefits. First, the device incorporates a spring that, depending upon device selection, is coupled to shaft 120 so as to bias moveable support 88 either toward the loading position or the processing position. For purposes of illustration, moveable support 88 is biased upward toward the loading position. Whether system 96 provides an upward or downward bias, the bias is easily overcome to change the position of moveable support 88 by pressurizing chamber 124 of device 122. In the illustrated embodiment, such pressure causes shaft 120, and hence moveable support 88, to move downward to the processing position. The bias is restored, and moveable support 88 returns to the loading position, by releasing the pneumatic pressure through a suitable exhaust port (not shown). Apparatus as shown includes two single acting, pneumatic cylinders, one for each bellows 101. These may be controlled using a single control signal with simple on/off control. Optionally, individual needle valves may be placed in pneumatic communication with each cylinder in order to synchronize and balance the motion of the two bellows 101.

In the preferred embodiment shown, each bellows 101 extends downward from portal 48 such that bellows 101 does not extend into chamber 18. Rather, only shaft 118, whose cross-section is much smaller than that of bellows 101, extends through portal 48. This allows portal 48 to be relatively small-sized, thus minimizing the opportunity for contamination to be introduced into chamber 18.

Bellows 101 is polymeric and may be formed from any suitable, inert, resilient polymeric material as described above. Use of a polymeric bellows avoids the use of metal materials, which tend to cause contamination of device 12. Metal materials are also much less resistant to the process gases typically used in many wafer processing applications. Preferred polymer bellows can also be formed from a single part, making it easier, as compared to metal bellows, to manufacture the bellows as well as making it easier to effectively seal portal 48. In contrast, metal bellows formed from separate parts have numerous joints whose integrity can be compromised through corrosive attack or if not manufactured carefully. Even if a metal bellows is made from a corrosion resistant metal such as stainless steel, the weld zones. An integral polymeric bellows also does not have separate parts that might otherwise rub against each other to generate undesirable debris.

Figure 7:
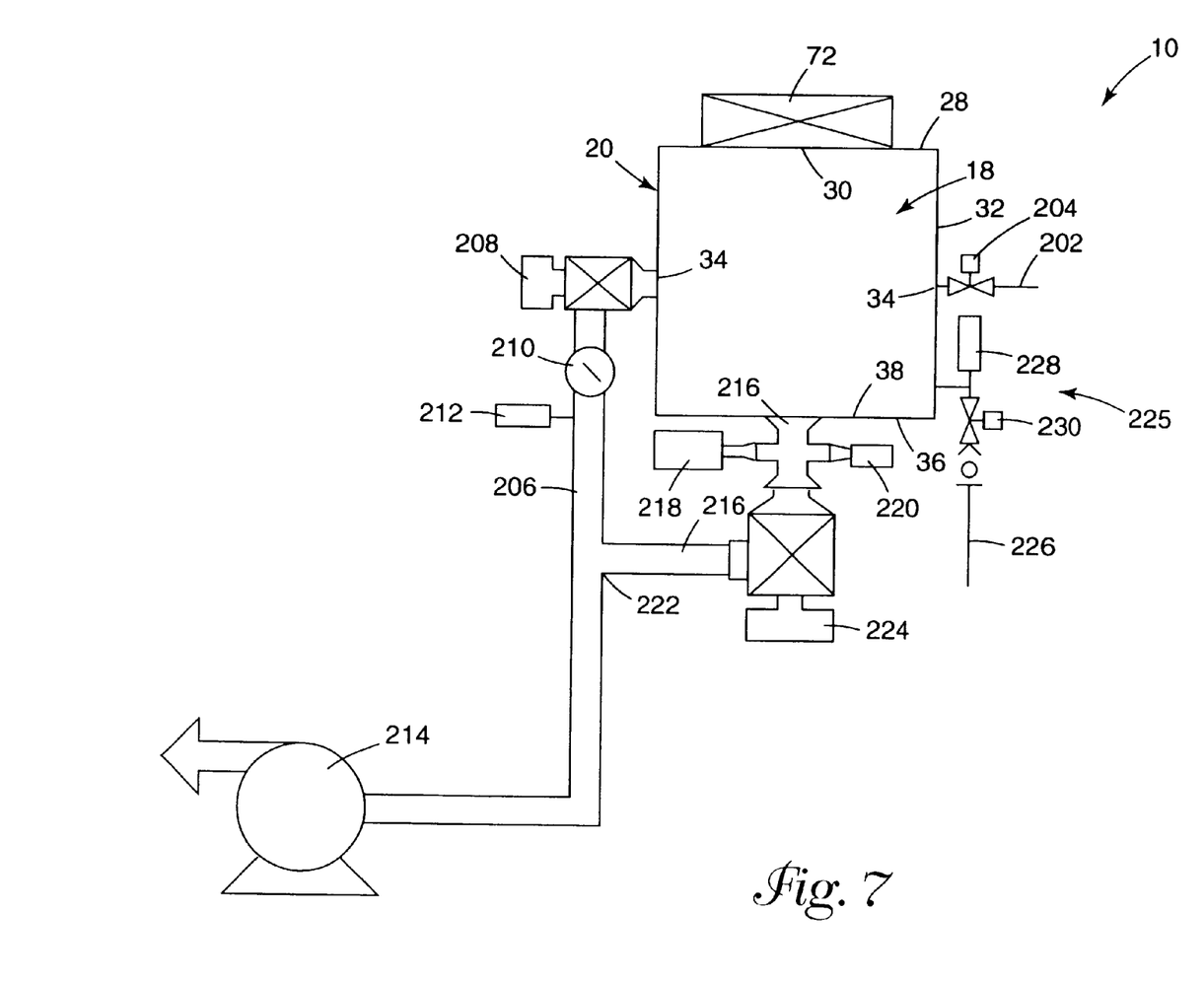
FIG. 7 is a schematic view of the apparatus of FIG. 1 interconnected with vacuum plumbing.

FIG. 7 is a schematic illustration of apparatus 10 interconnected with one embodiment of vacuum plumbing suitable in the practice of the present invention. Inlet gas line 202 transports one or more process gases through gas port 34 of one side wall 32. Valve 204 regulates gas flow into chamber 18. On the opposite side wall 32, process gases are exhausted through outlet gas line 206. Chamber exhaust valve 208 (Right angle NW 25) is used as on on/off device for vacuum pumping. Throttle valve 210 (NW 40) regulate the pressure of chamber 18 during processing. Pressure transducer 212 monitors the exhaust gas pressure. Vacuum pump 214 is used to establish a vacuum in chamber 18. Pump 214 is preferably a dry pump/blower combination with a base pressure of 1 millitorr or better and a pumping speed of at least 55 m$^3$/hr.

On rear wall 36, vacuum line 216 is fitted to portal 38 and is coupled to outlet gas line 206 at juncture 222. Process pressure transducer 218 (1000 torr capacitance manometer) and gas interlock pressure switch 220 (10 torr mini-capacitance manometer with 1 torr switch point) are fitted onto vacuum line 216. Process pressure transducer 218 is preferably a capacitance manometer pressure gauge (MKS model 017BA-0100) that is heated (e.g., in some treatments, maintained at 45 C.). Chamber roughing valve 224 (NW 40) is used to control the amount of vacuum that is pulled through vacuum line 216. Overpressure switch/venting system 225 is also provided to relieve overpressure inside chamber 18. Exhaust line 226 is fitted with over-pressure switch 228 (1000 torr strain-gauge type transducer), vent valve 230 (normally open 3-way diaphragm valve) and check valve 232.

Figure 8:
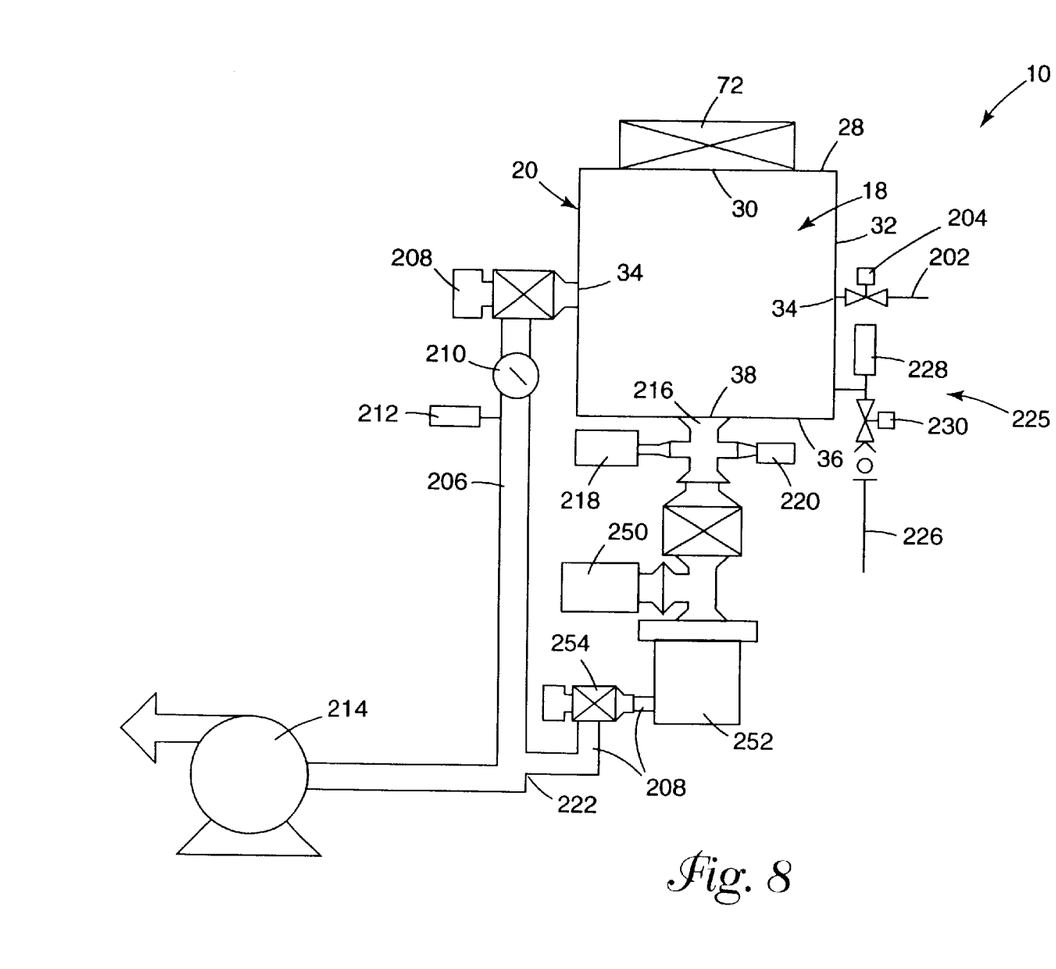
FIG. 8 is a schematic view of the apparatus of FIG. 1 interconnected with an alternative embodiment of vacuum plumbing.

FIG. 8 is a schematic illustration of apparatus 10 interconnected with another embodiment of vacuum plumbing suitable in the practice of the present invention. The vacuum plumbing of FIG. 9 is generally identical to that shown in FIG. 8, except that, instead of chamber roughing valve 224, vacuum line 216 of FIG. 9 is fitted with cold cathode ionization gauge 250, turbo pump 252, and turbo foreline isolation valve 254.

Apparatus 10 may be used to carry out a wide variety of processing treatments. Representative processing recipes for carrying out an etching processes with and without UV treatment are described in the following Tables 1, 2 and 3. Such processes are further described in U.S. Pat. No. 5,922, 219 and in Assignee's co-pending application Ser. No. 09/351,959 filed Jun. 16, 1998.

TABLE 1

Etch Process

| Step No. | 1 | 2 | 3 | 4 | 5 | 6 | 7 | 8 | 9 | 10 |
|---|---|---|---|---|---|---|---|---|---|---|
| Duration (seconds) | 5 | 6 | 20 | 50 | 5 | 10 | 5 | 10 | 5 | 10 |
| Step Name | Pump | Preheat | Stabilize | Etch | Pump | Purge | Pump | Purge | Pump | Backfill |
| $N_2$ (sccm) | 0 | 0 | 500 | 1000 | 0 | 2000 | 0 | 2000 | 0 | 2000 |
| HF (sccm) | 0 | 0 | 0 | 1000 | 0 | 0 | 0 | 0 | 0 | 0 |
| IPA (sccm) | 0 | 0 | 40 | 40 | 0 | 0 | 0 | 0 | 0 | 0 |
| $Cl_2$ (sccm) | 0 | 0 | 0 | 0 | 0 | 0 | 0 | 0 | 0 | 0 |
| Pressure set point (torr) | 0* | 0 | 100 | 100 | 0 | 0 | 0 | 0 | 0 | 10 |
| Chamber Exhaust Valve Setting | Open | Open | Open | Open | Open | Open | Closed | Open | Closed | Open |
| Turbo/Rough Valve Setting | Closed | Closed | Closed | Closed | Closed | Closed | Open | Closed | Open | Closed |
| Top UV lamp | Off | On | Off | Off | Off | Off | Off | Off | Off | Off |
| Bottom UV lamp | Off | Off | Off | Off | Off | Off | Off | Off | Off | Off |

*A set point of 0 as used in Tables 1, 2, 3 means the throttle valve is set wide open.

TABLE 2

UV Pretreat - Etch Process

| Step No. | 1 | 2 | 3 | 4 | 5 | 6 | 7 | 8 | 9 | 10 | 11 |
|---|---|---|---|---|---|---|---|---|---|---|---|
| Duration (seconds) | 5 | 6 | 20 | 20 | 50 | 5 | 10 | 5 | 10 | 5 | 10 |
| Step Name | Pump | Preheat | Pump | Stabilize | Etch | Pump | Purge | Pump | Purge | Pump | Backfill |
| $N_2$ (sccm) | 0 | 0 | 0 | 500 | 1000 | 0 | 2000 | 0 | 2000 | 0 | 2000 |
| HF (sccm) | 0 | 0 | 0 | 0 | 1000 | 0 | 0 | 0 | 0 | 0 | 0 |
| IPA (sccm) | 0 | 0 | 40 | 40 | 0 | 0 | 0 | 0 | 0 | 0 | 0 |
| $Cl_2$ (sccm) | 0 | 400 | 0 | 0 | 0 | 0 | 0 | 0 | 0 | 0 | 0 |
| Pressure set point (torr) | 0 | 10 | 0 | 100 | 100 | 0 | 0 | 0 | 0 | 0 | 10 |
| Chamber Exhaust Valve Setting | Open | Open | Open | Open | Open | Open | Open | Closed | Open | Closed | Open |
| Turbo/Rough Valve Setting | Closed | Closed | Closed | Closed | Closed | Closed | Closed | Open | Closed | Open | Closed |
| Top UV lamp | Off | On | Off | Off | Off | Off | Off | Off | Off | Off | Off |
| Bottom UV lamp | Off | Off | Off | Off | Off | Off | Off | Off | Off | Off | Off |

TABLE 3

UV Pretreat - Etch - UV Metals Removal Process

| Step No. | 1 | 2 | 3 | 4 | 5 | 6 | 7 | 8 | 9 | 10 | 11 | 12 | 13 |
|---|---|---|---|---|---|---|---|---|---|---|---|---|---|
| Duration (seconds) | 5 | 6 | 20 | 20 | 50 | 20 | 30 | 5 | 10 | 5 | 10 | 5 | 10 |
| Step Name | Pump | Preheat | Pump | Stabilize | Etch | Pump | Clean | Pump | Purge | Pump | Purge | Pump | Backfill |
| $N_2$ (sccm) | 0 | 0 | 0 | 500 | 1000 | 0 | 0 | 0 | 2000 | 0 | 2000 | 0 | 2000 |
| HF (sccm) | 0 | 0 | 0 | 0 | 1000 | 0 | 0 | 0 | 0 | 0 | 0 | 0 | 0 |
| IPA (sccm) | 0 | 0 | 0 | 40 | 40 | 0 | 0 | 0 | 0 | 0 | 0 | 0 | 0 |
| $Cl_2$ (sccm) | 0 | 400 | 0 | 0 | 0 | 0 | 400 | 0 | 0 | 0 | 0 | 0 | 0 |
| Pressure set point (torr) | 0 | 10 | 0 | 100 | 100 | 0 | 10 | 0 | 0 | 0 | 0 | 0 | 10 |
| Chamber Exhaust Valve Setting | Open | Open | Open | Open | Open | Open | Open | Open | Open | Closed | Open | Closed | Open |
| Turbo/Rough Valve Setting | Closed | Closed | Closed | Closed | Closed | Closed | Closed | Closed | Closed | Open | Closed | Open | Closed |
| Top UV lamp | Off | On | Off | Off | Off | Off | On | Off | Off | Off | Off | Off | Off |
| Bottom UV lamp | Off | Off | Off | Off | Off | Off | On | Off | Off | Off | Off | Off | Off |

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. An apparatus for processing a microelectronic device, comprising:
   (a) a chamber in which the microelectronic device is positioned during a treatment, said chamber comprising at least one through portal;
   (b) a transport mechanism upon which the microelectronic device is supported and transportable through a range of motion comprising a first position to a second position;
   (c) a polymeric, closed bellows environmentally sealing the portal of the chamber, said bellows having a fixed end and a moveable end, wherein the moveable end is operationally coupled to the transport mechanism such that actuation of the moveable end causes a corresponding movement of the transport mechanism to allow transport of the microelectronic device.

2. The apparatus of claim 1, wherein the first position corresponds to a loading position, and wherein polymeric, closed bellows is biased such that the transport mechanism supports the microelectronic device in the loading position in the absence of an actuation force acting upon the bellows.

3. The apparatus of claim 1, wherein the second position corresponds to a treatment position, and wherein polymeric, closed bellows is biased such that the transport mechanism supports the microelectronic device in the treatment position in the absence of an actuation force acting upon the bellows.

4. The apparatus of claim 1, wherein the moveable end of the polymeric bellows is closed.

5. The apparatus of claim 4, wherein the moveable end of the polymeric bellows is positioned outside the chamber.

6. The apparatus of claim 4, wherein the moveable end of the polymeric bellows is positioned inside the chamber.

7. The apparatus of claim 1, wherein the transport mechanism comprises a ring-shaped frame.

8. The apparatus of claim 7, wherein the chamber is defined at least in part by a chamber wall comprising a pocket that is configured to receive the ring-shaped frame when the transport mechanism is actuated to cause transport of the microelectronic device to the second position.

9. The apparatus of claim 1, comprising a first window through which a first fluence of energy can be irradiated onto a first surface of the microelectronic device and a second window through which a second fluence of energy can be irradiated onto a second surface of the microelectronic device.

10. The apparatus of claim 9, wherein at least one of said windows comprises sapphire.

11. The apparatus of claim 1, wherein the polymeric bellows comprises a plurality of convolutions.

12. The apparatus of claim 11, wherein at least a portion of the convolutions comprises a rectilinear contour, a curvilinear contour, or combinations thereof.

13. The apparatus of claim 1, wherein the transport mechanism is operationally coupled to the bellows by a first shaft, and wherein the apparatus further comprises a second shaft operationally coupling the moveable end of the bellows to an actuation mechanism.

14. An apparatus for processing a microelectronic device with one or more process gases, comprising:
   (a) an enclosure defining a chamber in which the microelectronic device is positioned during a treatment, said chamber comprising a wall having a pocket; and (b) a transport mechanism comprising a moveable member that is transported through a range of motion comprising a loading position and a processing position, said member being positioned at least partially in the pocket when the member is in the processing position.

15. The apparatus of claim 14, further comprising a polymeric, closed bellows environmentally sealing a portal of the chamber, said bellows having a fixed end and a moveable end, wherein the moveable end is operationally coupled to the transport mechanism such that actuation of the moveable end causes a corresponding movement of the transport mechanism through a range of motion comprising at least the first and second positions.

16. The apparatus of claim 15, wherein the polymeric, closed bellows is biased such that the transport mechanism is in the loading position in the absence of an actuation force acting upon the bellows.

17. The apparatus of claim 15, wherein the polymeric, closed bellows is biased such that the transport mechanism supports the microelectronic device in the treatment position in the absence of an actuation force acting upon the bellows.

18. The apparatus of claim 14, wherein the moveable member of the transport mechanism comprises a ring-shaped frame and a plurality of support pins projecting from the frame to support the microelectronic device, and wherein the wall pocket is configured to receive at least a portion of the ring-shaped frame when the transport mechanism is in the processing position.

19. The apparatus of claim 18, wherein the ring-shaped frame comprises a surface that is substantially flush with the chamber wall when the ring-shaped frame is positioned in the pocket.

20. The apparatus of claim 14, further comprising a first window through which a first fluence of energy can be irradiated onto a first surface of the microelectronic device and a second window through which a second fluence of energy can be irradiated onto a second surface of the microelectronic device.

21. The apparatus of claim 20, wherein at least one of said windows comprises sapphire.

22. The apparatus of claim 15, wherein the transport mechanism is operationally coupled to the bellows by a first shaft, and wherein the apparatus further comprises a second shaft operationally coupling the moveable end of the bellows to an actuation mechanism.

* * * * *